(12) United States Patent
Nguyen et al.

(10) Patent No.: US 7,142,314 B2
(45) Date of Patent: Nov. 28, 2006

(54) WAFER STAGE POSITION CALIBRATION METHOD AND SYSTEM

(75) Inventors: Phong T. Nguyen, Vancouver, WA (US); Stephen L. Hill, Vanvouver, WA (US); Nadja Orlova, Vancouver, WA (US)

(73) Assignee: Wafertech, LLC, Camas, WA (US)

( * ) Notice: Subject to any disclaimer, the term of this patent is extended or adjusted under 35 U.S.C. 154(b) by 369 days.

(21) Appl. No.: 10/716,814

(22) Filed: Nov. 19, 2003

(65) Prior Publication Data

US 2005/0105102 A1    May 19, 2005

(51) Int. Cl.
*G01B 11/14* (2006.01)
(52) U.S. Cl. ..................................... 356/620
(58) Field of Classification Search ................ 356/124, 356/399–401, 237.4, 237.1, 614, 620; 382/144; 250/201.3, 305; 355/53–55
See application file for complete search history.

(56) References Cited

U.S. PATENT DOCUMENTS

| | | | | |
|---|---|---|---|---|
| 4,780,617 A * | 10/1988 | Umatate et al. | ............ | 250/548 |
| 5,153,916 A * | 10/1992 | Inagaki et al. | .............. | 382/151 |
| 5,805,273 A * | 9/1998 | Unno | ........................... | 355/30 |
| 5,808,910 A * | 9/1998 | Irie et al. | ..................... | 700/279 |
| 6,481,003 B1 * | 11/2002 | Maeda | ......................... | 716/21 |
| 6,885,450 B1 * | 4/2005 | Fukui | ......................... | 356/401 |

* cited by examiner

*Primary Examiner*—Hwa (Andrew) Lee
*Assistant Examiner*—Isiaka O. Akanbi
(74) *Attorney, Agent, or Firm*—Duane Morris LLP; Steven E Koffs

(57) ABSTRACT

A method of calibrating a positioning stage includes placing a substrate on the positioning stage. The substrate has a contrast film above a portion of the substrate. At least one pattern is at a predetermined location above the substrate, corresponding to a predetermined location on the positioning stage if the positioning stage has zero offset from a registration position. A beam is applied to a position where the pattern on the substrate would be located if the positioning stage has zero offset. At least one of the group consisting of reflected, transmitted and scattered portions of the beam is measured. Whether the positioning stage has a non-zero offset is detected based on the measured portion of the beam.

26 Claims, 7 Drawing Sheets

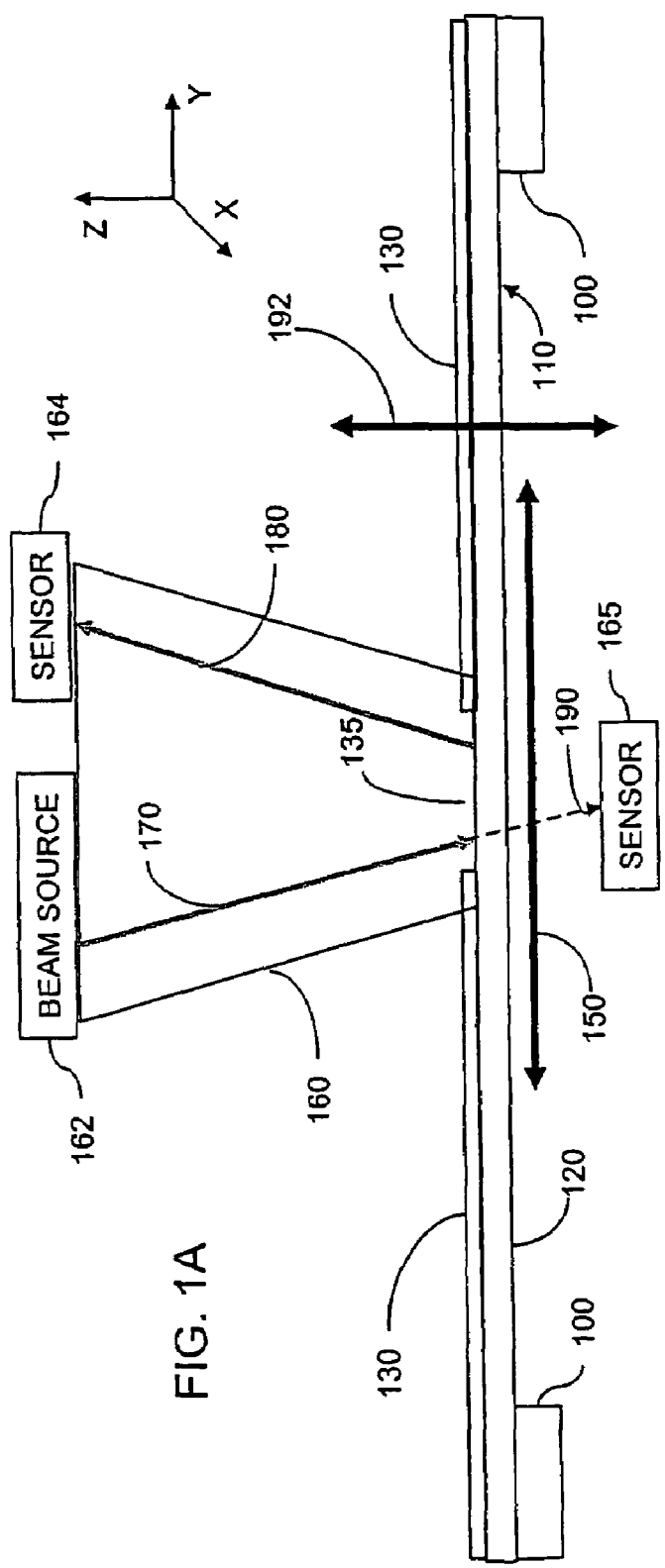
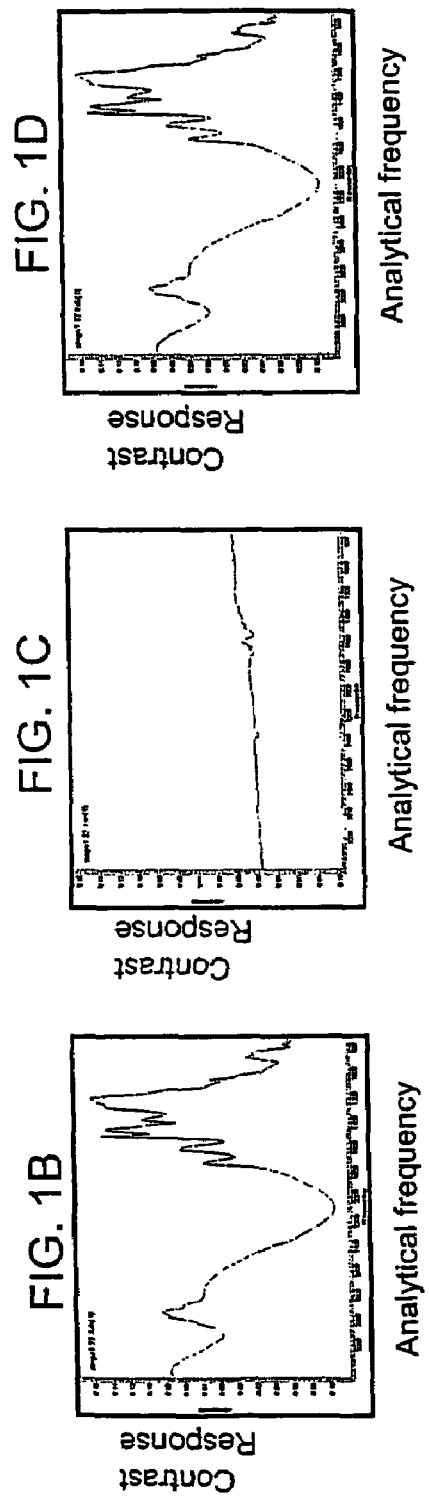
FIG. 1A
FIG. 1B
FIG. 1C
FIG. 1D

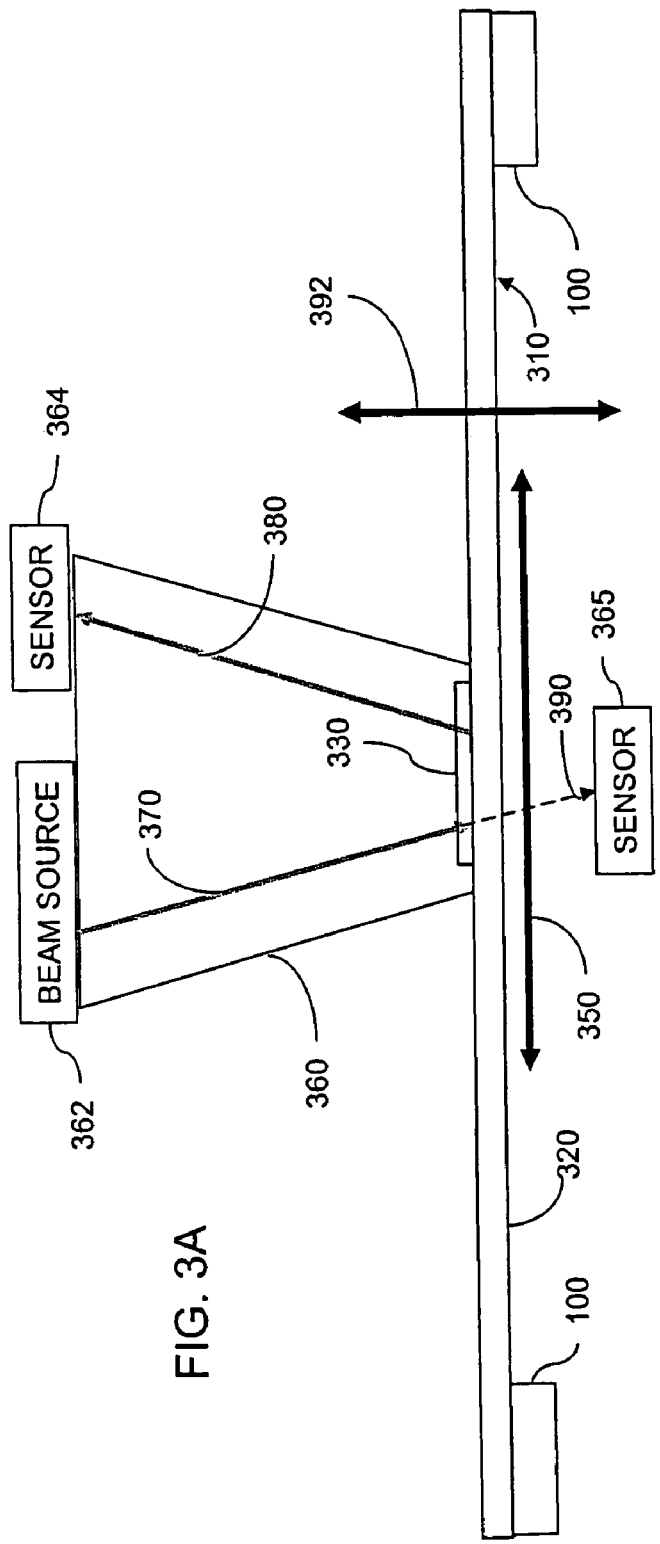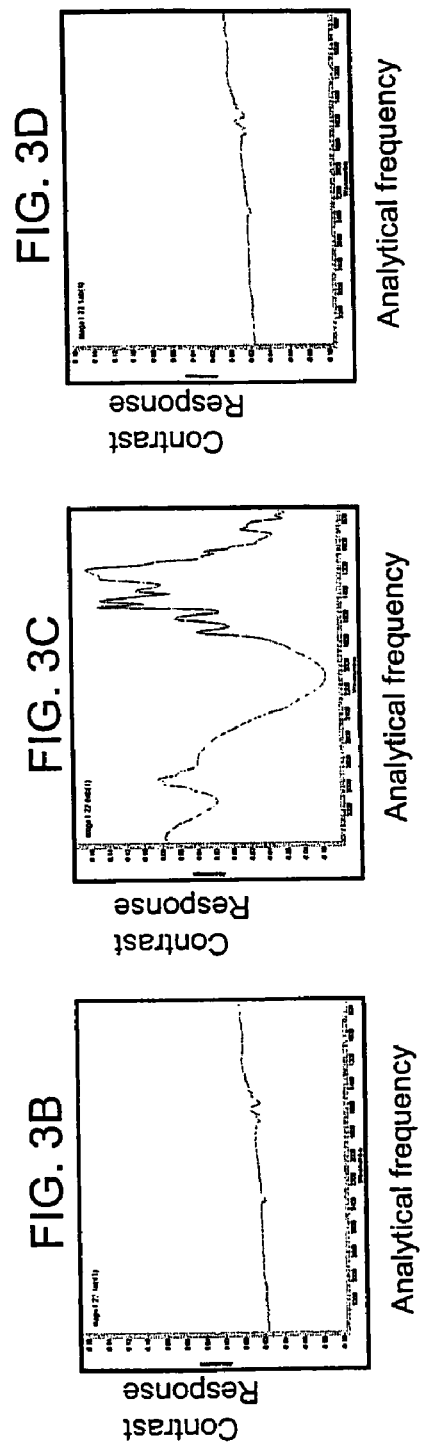

WAFER STAGE POSITION CALIBRATION METHOD AND SYSTEM

FIELD OF THE INVENTION

The present invention relates to semiconductor fabrication generally, and more specifically to methods for calibrating positional offset of a wafer stage.

BACKGROUND

A variety of metrology tools have been used to measure process performance on both monitor and product wafers. A general measurement may be taken at the wafer center. Typically, a measurement profile may be performed at a number of wafer sites to establish uniformity as a function of radial distribution or angle (theta). Stage repeatability and accuracy is a primary source of measurement drift. For example, a stage offset can impair the uniformity of film thickness in important layers, such as the gate oxide layer, reducing product yield. It has been determined that a stage offset of less than 2 mm can influence routine statistical process control (SPC) monitor status and unnecessarily impact tool availability. Traditional stage calibration sensitivity to stage drift is relatively weak.

Fourier transform infrared (FTIR) spectroscopy is a representative wafer metrology technique in that numerous measurement applications can be performed, such as oxide dopant concentration (Boron, Phosphorous, Fluorine), film thickness (epitaxial silicon, oxide, nitride, photoresist), and bare silicon impurity concentrations (interstitial oxygen, substitutional carbon). FTIR is sensitive to molecular absorption of light in the 2–40 μm wavelength range. FTIR measurements can be performed using either transmitted or reflected mode. For example, transmission methods are typically used for calibrating position of a stage holding a bare silicon wafer. The wafer stage accommodates unobstructed illumination above and below the wafer using two vacuum "finger" supports located at a radius of 95 mm and theta 90 and 270 degrees.

The FTIR stage is calibrated interactively by visually aligning a HeNe laser image to center and edge scribe lines on a bare wafer. Another demonstrated calibration technique is based upon relative infrared signal strength for a wafer with pre-drilled aperture holes. Both methods are insensitive, and the time-intensive results show limited accuracy.

An improved wafer stage calibration method is desired.

SUMMARY OF THE INVENTION

A method of calibrating a positioning stage includes placing a substrate on the positioning stage. The substrate has a contrast film above a portion thereof, with at least one pattern at a predetermined location above the substrate, corresponding to a predetermined location on the positioning stage if the positioning stage has zero offset from a registration position. A beam is applied to a position where the pattern on the substrate would be located if the positioning stage has zero offset. At least one of the group consisting of reflected, transmitted and scattered portions of the beam is measured. Whether the positioning stage has a non-zero offset is detected based on the measured portion of the beam.

A monitor wafer comprises a semiconductor substrate; and a contrast film above the substrate. The contrast film includes a plurality of positive or negative patterns of geometrical objects distributed at a plurality of respectively different angles with respect to a reference location on the substrate.

BRIEF DESCRIPTION OF THE DRAWINGS

FIG. 1A is a diagram showing an exemplary system according to one embodiment of the invention using a negative photoresist.

FIG. 1B shows a frequency response of the signal detected by the sensor in FIG. 1A, when the calibration stage is offset in a first direction.

FIG. 1C shows a frequency response of the signal detected by the sensor in FIG. 1A, when the calibration stage has zero offset.

FIG. 1D shows a frequency response of the signal detected by the sensor in FIG. 1A, when the calibration stage is offset in a second direction opposite the first direction.

FIG. 3A shows an exemplary system according to one embodiment of the invention using a positive photoresist.

FIGS. 3B–3D show frequency response of the signal detected by the sensor in FIG. 3A, when the calibration stage has an offset in a first direction, a zero angle offset, and an offset in a second direction opposite the first direction, respectively.

DETAILED DESCRIPTION

Figure 2A:
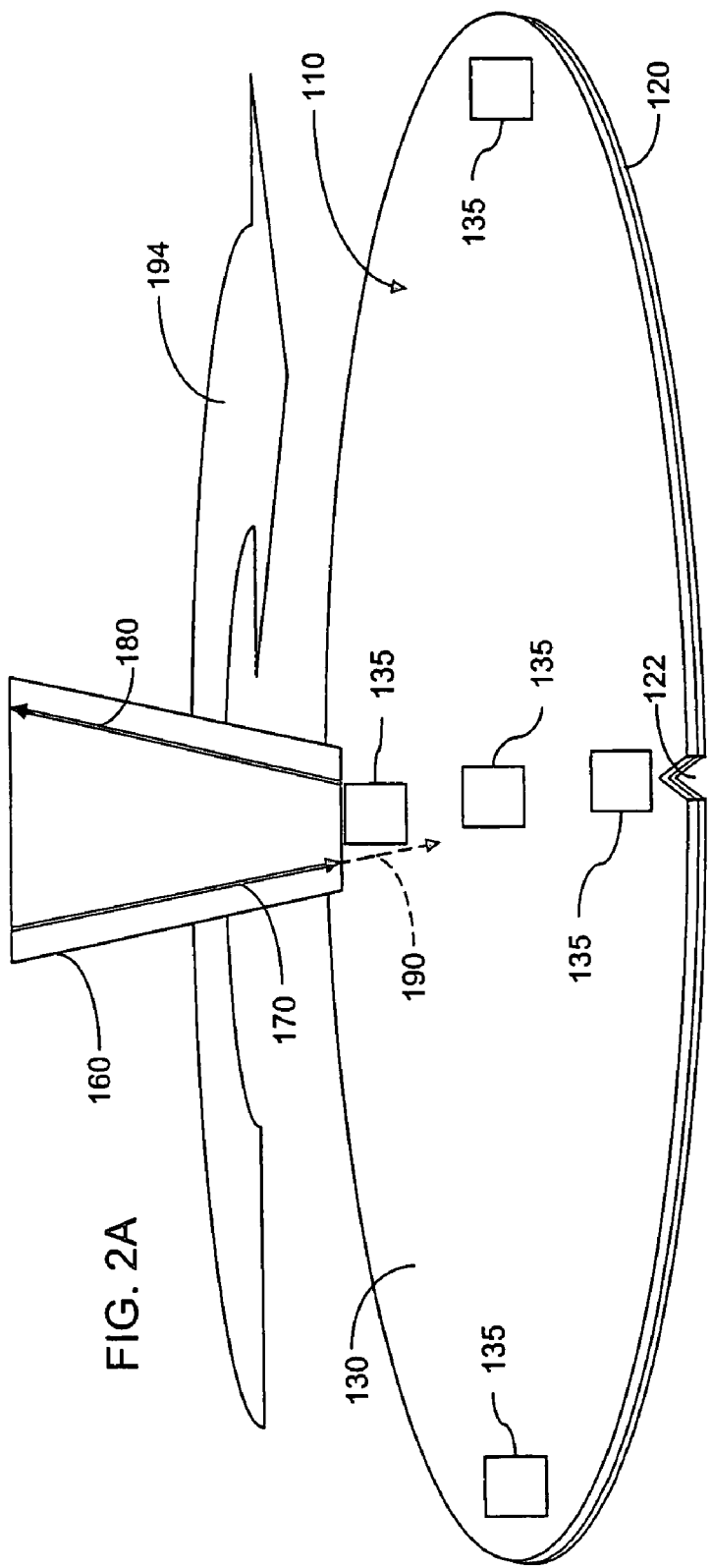
FIG. 2A is an isometric view of the monitor wafer of FIG. 1A.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly,"etc.) should be construed to refer to the orientation as then described or as shown in the drawing under discussion. These relative terms are for convenience of description and do not require that the apparatus be constructed or operated in a particular orientation.

The inventors have determined that, although the wafer stage may exhibit an offset and/or rotation from its nominal position, a standardized wafer can be centered on the wafer stage accurately and consistently. Patterns can be formed on a standardized wafer with high dimensional accuracy. Thus, by optically or electronically monitoring the locations of the patterns on the monitor wafer that is centered on the stage, any positional offset of the wafer stage can be detected. By understanding the stage offset, the offset can be compensated for when measurements are taken from other bare wafers.

FIG. 1A is a diagram of a system for calibrating a positioning stage, such as wafer stage 100. The wafer stage 100 may be part of a metrology tool, for example.

A substrate, which may be a monitor wafer 110, is adapted to be placed on the wafer stage 100. The monitor wafer 110 has a substrate 120, which may be a semiconductor wafer (e.g., silicon, GaAs, or the like). The substrate 120 has a contrast film 130 on a portion thereof, with at least one pattern 135 at a predetermined location on the wafer. The contrast film may comprise at least one of the group consisting of photoresist, metal, oxide, and nitride. The monitor wafer may include an etch modified substrate. In the example of FIG. 1A, the contrast film 120 comprises a negative photoresist, and the pattern comprises one or more openings 135.

The predetermined location of the pattern 135 on the monitor wafer 110 corresponds to a predetermined location on the wafer stage, if the wafer stage has zero offset from a registration position. In other words, if the wafer stage has no offset, then the pattern 135 is accurately located at the predetermined location when the monitor wafer is centered on the wafer stage. If the wafer stage 100 has a translational or angular offset, then the pattern 135 is located at a position that deviates from the expected predetermined location.

A beam source 162 applies a beam 160 to a position where the pattern 135 on the wafer 110 would be located if the wafer stage 100 has zero offset. The beam source 162 may be a source of Microwave, Infrared, Visible, UV, or X ray radiation, or an electron beam source. In an exemplary embodiment, the beam source is an infrared source for FTIR spectroscopy.

A sensor measures at least one of the group consisting of reflected, transmitted and scattered portions of the beam. FIG. 1A shows a reflected portion 180 and a transmitted portion 190. A sensor 164 may be positioned to receive reflected light, and/or a sensor 165 may be positioned on the side of the substrate 120 opposite the beam source 162, to detect transmitted light (in which case the substrate 120 is formed of a transparent material, or a material having a high transmittance in the pertinent energy band of the incident beam 170). Although two sensors 164 and 165 are shown, the system may include a single sensor 164 above the substrate for only detecting reflected light 180, or the system may include a single sensor 165 on the bottom of the substrate 120 for measuring transmitted light 190 or scattered light.

One of ordinary skill in the art will understand that the substrate material and contrast film material should be selected so that there is a substantial difference in the optical properties of the two materials in the wavelength band corresponding to the beam source 162. For example, to achieve the frequency responses shown in FIGS. 1B–1D using a negative resist for the contrast film, the reflectance of the contrast film 130 should be much greater than the reflectance of the substrate 120 in the relevant band.

The system includes means for detecting whether the wafer stage 100 has a non-zero offset based on the measured portion 180 of the beam 160. The detecting means is described in greater detail below. The detecting means includes computer program code for determining a position of the stage that minimizes or maximizes the signal 180.

FIGS. 1B–1D show three exemplary FTIR frequency responses of reflected light that may be observed by the sensor 164, depending on the magnitude of the stage offset, where the stage offset may have a negative value, a zero value, or a positive value. In FIGS. 1B–1D, the frequency response of transmitted light is ignored, but in other examples, the transmitted light may be considered. For a contrast film 120 comprising a negative photoresist, in which the pattern comprises one or more openings 135, the measured portion 180 of the beam 160 has a first frequency distribution shown in FIG. 1C if the wafer stage has a zero offset. The frequency response is very flat, and may be approximately zero. FIG. 1B shows a second frequency response of the signal 180 observed if the wafer stage has a non-zero offset, or stage axis error 150. In the example, the same second frequency response is observed when the offset 150 is a negative value as when the offset is a positive value with the same magnitude.

Given a stage offset 150 of magnitude D (yielding a response as shown in FIG. 1B or 1D), the signal 180 can be minimized (as shown in FIG. 1C) by moving the wafer stage by a distance of −D. Once the total stage displacement needed to reach the frequency response of FIG. 1C is measured, the wafer stage offset 150 can be readily determined as (−1) times the displacement through which the stage is moved to minimize the signal 180.

Although FIG. 1A shows the stage offset (stage axis error) in the Y dimension, the same method is used for the orthogonal direction X (into and out of the page) in the plane of the wafer 110. The only difference is that the stage is moved in the X direction to minimize the frequency response of signal 180. Note that, because there may be positional errors in both the X and Y directions, minimizing the frequency response of signal 180 by compensating for the stage axis error in one direction can still leave a significant non-zero signal 180 due to stage offset (axis error) in the orthogonal direction. Nevertheless, minimizing the signal 180 with respect to movement of the stage along a single direction at a time (X or Y) locates the optimum position along that direction.

A variety of techniques may be used to find the minimum frequency response position. The stage can be controlled manually, using trial and error. Automated control methods may also be used. For example, an initial interval extending on both sides of the zero offset stage position can be selected (large enough to have a high degree of probability of including the stage position that produces the minimum response). An initial small displacement increment may be selected, and the stage can be moved through the initial interval using that initial increment. The frequency response is measured again at each incremental position. When a local minimum is observed, the interval is reduced so that the beginning and end of the interval are the two nearest positions on either side of the local minimum. The increment can be reduced (e.g., by one half), and the stage can be moved between the two positions on either side of the local minimum. This procedure can be repeated, reducing the interval through which the stage is traversed between the points on either side of the local minimum at each iteration. When the interval is reduced to any desired value, then the location of the absolute minimum has been determined with a maximum error equal to the size of the interval during the last iteration. A variety of other numerical techniques may be used to automatically search for the wafer stage position at which the frequency response is minimized.

Although the above example relates to stage position offsets, a similar result is observed when there is a stage focus error 192. By moving the stage in the direction orthogonal to the plane of the wafer 120 (e.g., up or down), the frequency response of signal 180 varies, with a minimum occurring when the stage is at the optimum stage focus position in the Z direction. The stage focus error is then determined as being (−1) times the Z distance through which the stage is moved to minimize the signal 180.

FIG. 2A is an isometric view of the wafer 110. Preferably, the wafer includes a plurality of patterns of geometric objects 135. In FIG. 2A, the geometric objects are rectangles, but any shape may be used. Rectangles are advantageous because they may simplify computations relative to other geometric shapes. Further, if scattered light is to be measured, then the patterns may be diffraction gratings (not shown), for example, comprising groups of parallel lines.

In preferred embodiments, the contrast film 130 includes a plurality of positive or negative patterns comprising geometrical objects distributed at a plurality of respectively different angles with respect to a reference location (e.g., the notch 122) on the substrate. In the example of FIG. 2A, the patterns include four rectangles 135 spaced 90 degrees apart and located proximate to a circumference of the monitor wafer. In another embodiment, the wafer has eight rectangles spaced 45 degrees apart. A central rectangle is also provided. Wafer 110 also has a notch 122 which establishes a zero-reference angle along the circumference of the wafer. In alternative embodiments, several patterns 135 may be placed near the center, with zero or fewer patterns near the circumference of the wafer.

In preferred embodiments, the wafer includes at least a second pattern 135 disposed at a different angular position on the wafer from the first pattern, to enable wafer stage angular offset 194. The system further comprises means for determining a translation vector separating the first and second patterns, and means for detecting an angular offset 194 of the wafer stage, based on the translation vector.

Figure 2D:
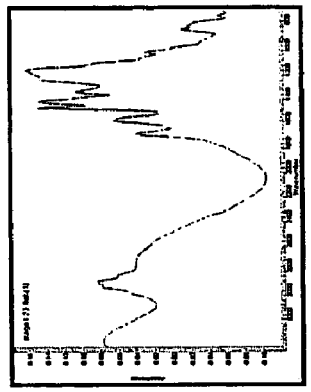
FIGS. 2B–2D show frequency response of the signal detected by the sensor in FIG. 1A, when the calibration stage has an positive angle offset, a zero angle offset, and a negative angle offset, respectively.
Figure 2C:
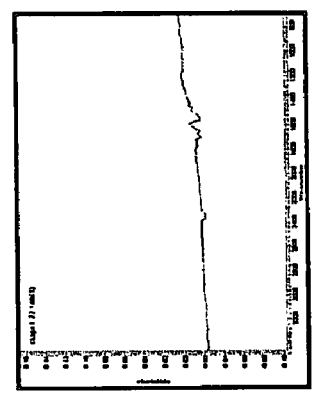
Figure 2B:
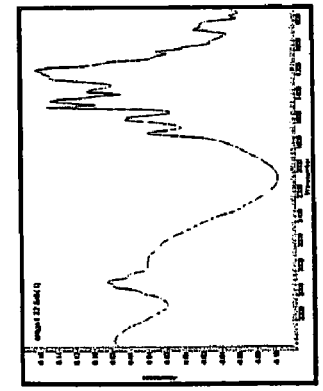

The translation determining means identifies a stage position corresponding to one of the patterns 135, as described above. The stage is then moved by an "expected translation vector" (corresponding to the expected zero-angular-offset position of the second pattern), so that the beam 170 is focused on the approximate location of the second pattern (e.g., a pattern that is 180 degrees apart from the first pattern). For example, the stage may be moved by the distance that would be correct for focusing the beam 170 on the second pattern if there is no stage angular offset. If there is an angular offset 194, then an expected translation vector corresponding to the expected (zero angular offset) position of the second pattern results in a substantial frequency response signal 180. The actual location of the second pattern is determined iteratively by moving the stage until the signal 180 is minimized, in the manner described above with respect to FIGS. 1A–1D. The frequency response for positive, zero and negative stage angle offsets would be similar to those shown in FIGS. 2B, 2C and 2D, respectively. By subtracting the location of the first pattern from the actual location of the second pattern, the "actual translation vector" between the two is identified. The angle between the "actual translation vector" and the "expected translation vector" corresponds to the angular offset of the wafer stage.

FIGS. 3A–3D and 4A–4D show how the methods of FIGS. 1A–1D and 2A–2D, respectively, would be performed if the monitor wafer 310 contains positive patterns 330 of geometric objects. The exemplary wafer 310 includes a substrate 320 with a positive pattern of a contrast film, which may be an organic photoresist. Alternative contrast film materials may include metal, oxide, or nitride, or an etch modified substrate may be used.

The beam source 362 provides a beam 360 including incident radiation 370. A sensor 364 collects a reflected portion 380 of the beam. In other embodiments, the sensor 364 is located below the wafer 310 and detects a transmitted portion 390 of the beam, or a diffracted beam (not shown). The frequency response of the signal 380 is analyzed.

As shown in FIGS. 3B–3D, in the case of a positive pattern on a transparent substrate, the frequency response is maximized when the beam 370 is directed on the pattern. If the beam is off the pattern, then the frequency response is much lower, and may be approximately zero. Thus, in order to detect an offset, the wafer stage is positioned with the expected position of one of the patterns 330 in the field of view of the incident beam 370. If the frequency response is small, the wafer stage is reiteratively moved until the signal is maximized, corresponding to the stage at its optimal position. The wafer stage offset 350 is then determined as the distance between the expected position for maximum signal 380 and the actual position for maximum signal. Similarly, the stage focus offset error 392 can be determined by raising and lowering the wafer stage 100 until the detected signal 380 is maximized, to determine the location for the optimum focus, and the offset between the optimum focus and the expected height of the stage for optimum focus.

Figure 4A:
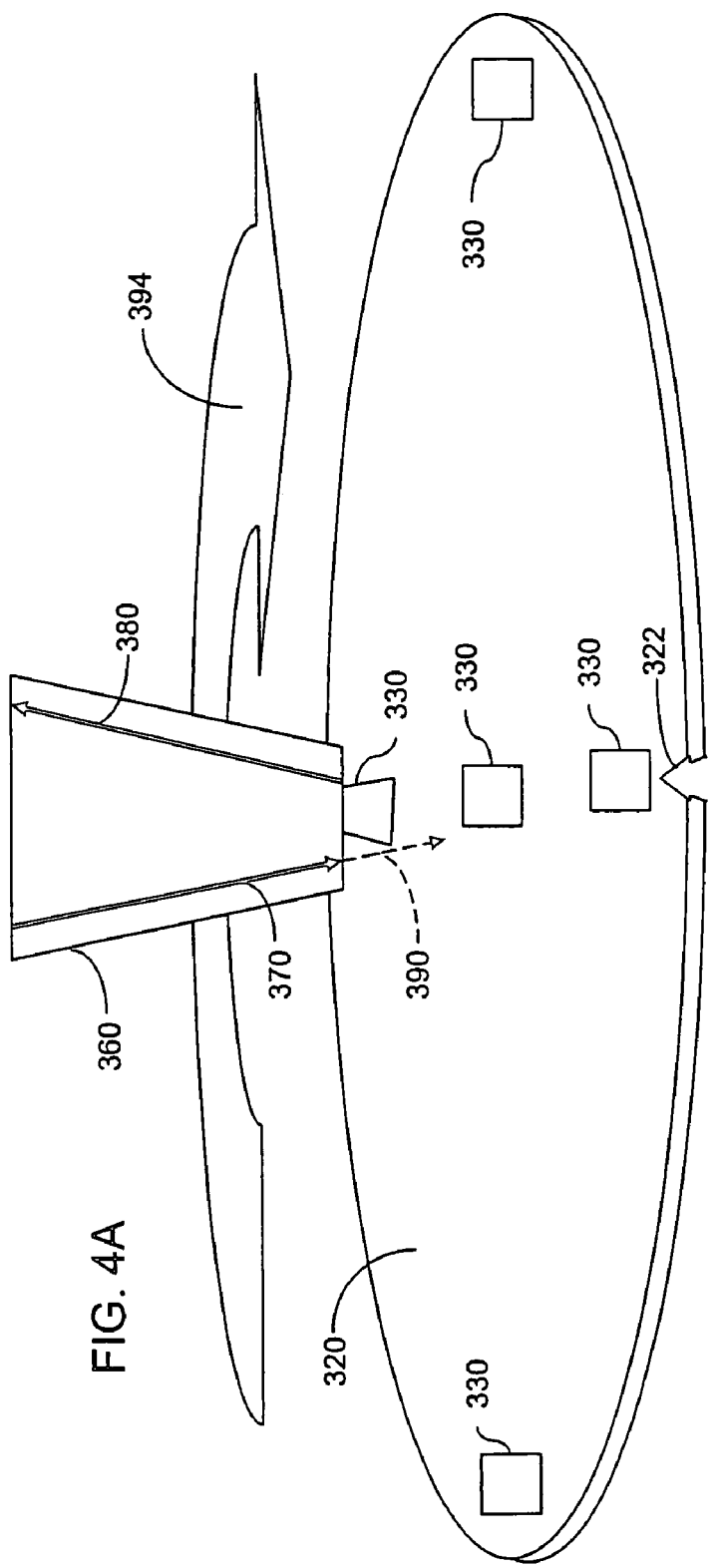
FIG. 4A is an isometric view of the monitor wafer of FIG. 3A.
Figure 4B:
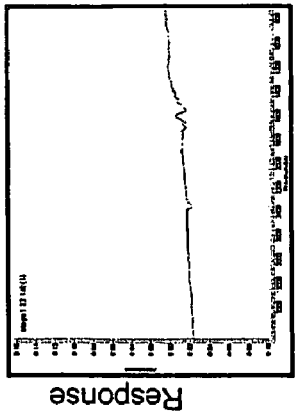
FIGS. 4B–4D show frequency response of the signal detected by the sensor in FIG. 4A, when the calibration stage has an positive angle offset, a zero angle offset, and a negative angle offset, respectively.
Figure 4C:
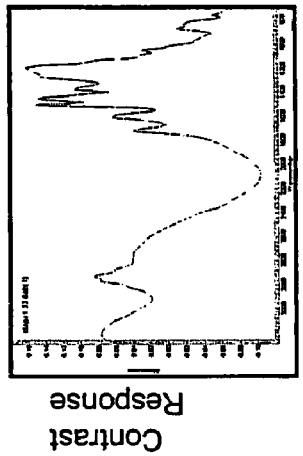
Figure 4D:
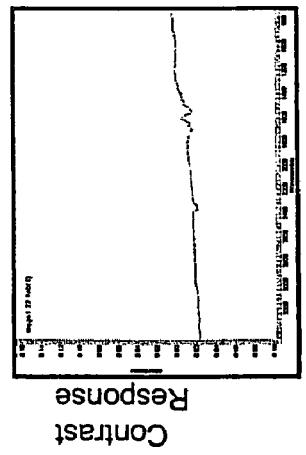

FIGS. 4A–4D show the exemplary wafer having a plurality of positive patterns 330 on the substrate 320. The procedure for determining the stage angular offset is similar to that described above with reference to FIGS. 2A–2D, except that the actual locations of the patterns 330 are found by maximizing the frequency response of the signal 380, as shown in FIGS. 4C. An expected translation vector between a first one of the patterns 330 and a second one of the patterns is calculated, and an actual translation vector is determined based on the measured signals 380 (and/or 390). The angle between these two vectors corresponds to the stage angular offset 394.

Figure 5:
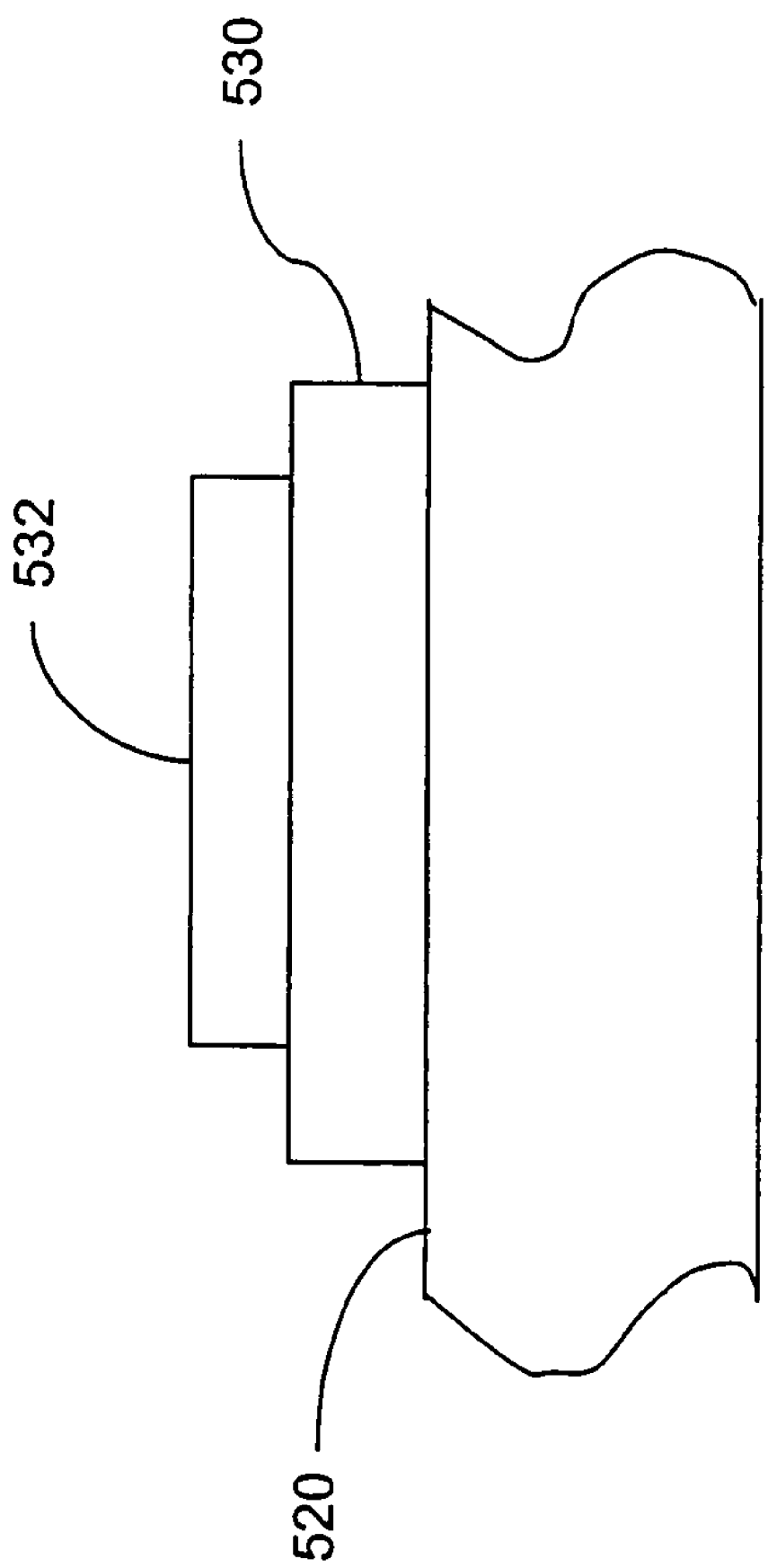
FIG. 5 is a cross sectional view of a portion of a monitor wafer having two contrast layers.

FIG. 5 is a cross sectional view of an "etch-modified" wafer 520 having a multi-layer pattern thereon. A pattern 530 similar to the patterns 330 described above with reference to FIGS. 3A–4D is formed above the substrate 520. At least one additional layer 532 is formed above the first pattern layer 530. The pattern 532 is preferably smaller than the pattern 530, to form a step at each edge, so that an incident beam can be reflected off of both edges. The detecting means determines whether the wafer stage has an offset based on the measured portion of the beam reflected, transmitted or scattered portions from the first film and the measured portion of the beam reflected, transmitted or scattered portions from the second film.

In some scenarios, the frequency responses of the two layers 530 and 532 may differ from each other, so that a high signal value is detected in a first one of the layers at a frequency for which the other of the layers has a low signal value. By combining the results of both signals, it becomes easier to distinguish the optimum location of the wafer stage.

In some embodiments, the plurality of geometrical objects includes a plurality of first rectangular contrast film portions 530, and the monitor wafer further includes a plurality of second rectangular contrast film portions 532 on one or more of the first rectangular contrast film portions. In other embodiments, either the first portions 530 or the second portions 532 may have non-rectangular shapes. In some embodiments, the first and second layers 530 and 532 formed for each of the patterns of geometric objects.

In one example, the substrate 520 is silicon, the first film 530 is a silicon oxide, and the second film 532 is a photoresist.

Although FIG. 5 shows an example in which a positive pattern is deposited on the substrate, in other embodiments (not shown), two contrast film layers are formed on the substrate; both contrast layers are etched to form openings all the way to the substrate, with the openings in the top contrast layer larger than the openings in the bottom contrast layer. This provide an alternative way to achieve a stepped configuration of two contrast layer materials.

Figure 6:
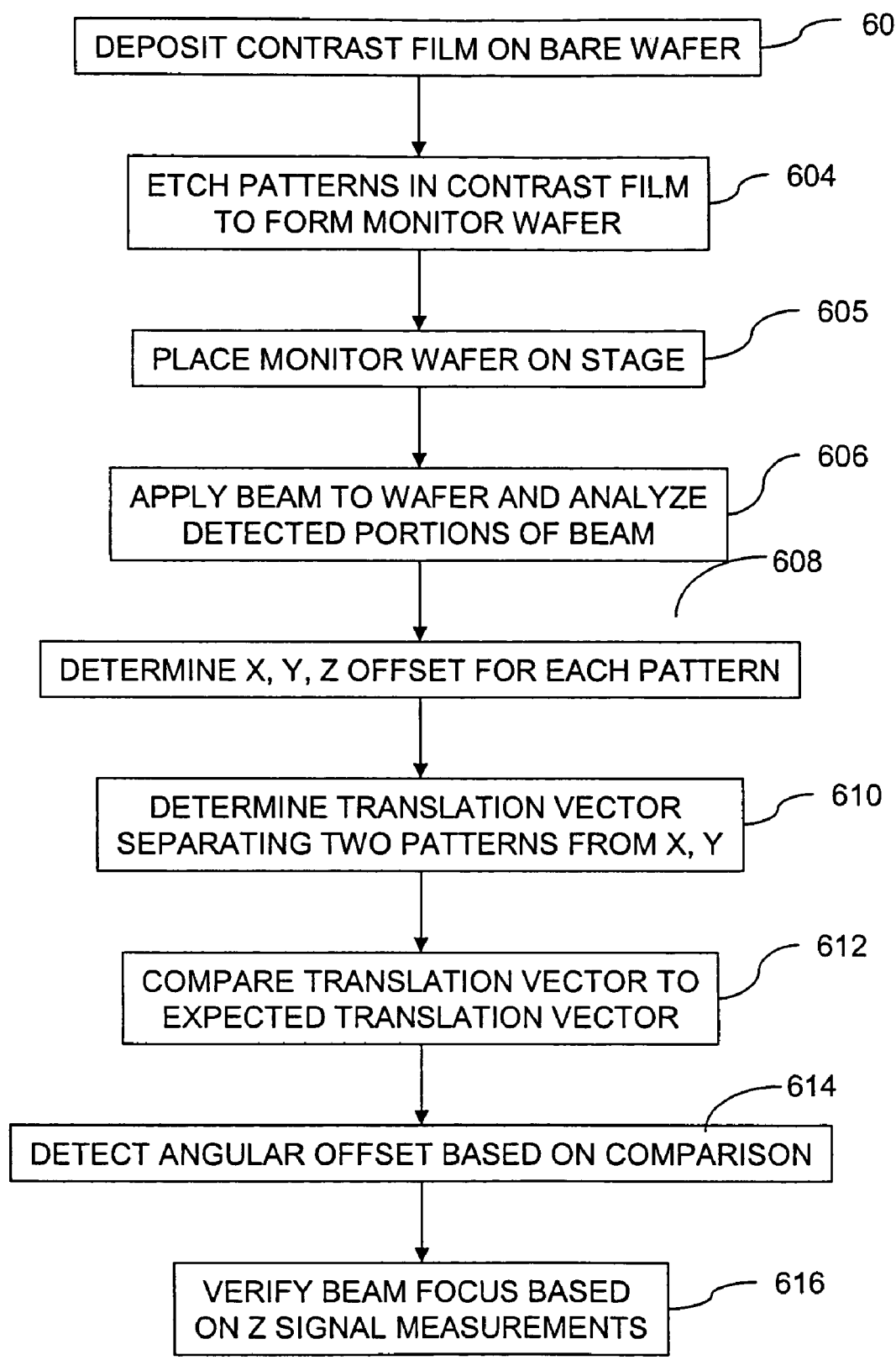
FIG. 6 is a flow chart diagram of a method for calibrating and focusing a wafer stage.

FIG. 6 is a flow chart showing an example of one process for calibrating wafer stage offsets 150, focus errors 192 and angular offsets 194.

At step 602, (for a negative film pattern) a contrast film is deposited on a bare wafer. The photo-resist film is deposited and evaporated onto the bare wafer or a wafer with a deposited film of interest.

At step 604, in some embodiments, the contrast film is etched to form patterns comprising geometric objects in the monitor wafer. If a negative photoresist is used, the patterns are typically etched, and the remainder of the contrast film is masked. If a positive photoresist is used, the patterns are typically masked, and the remainder of the contrast film is etched.

Generally, using the clear out window on any reticle, specified target areas and patterns are exposed and developed. For simplicity, a 6 mm square void window may be used; films composed of materials other than photoresist (metals, oxides/nitrides, etch-modified substrates, etc.) using a variety of target sizes and patterns can be developed for metrology tool-specific requirements.

An exemplary calibration wafer designed for infrared calibration is produced using two routine photo process steps:

A typical photo process includes the following eight steps:
Expose wafer to Hexamethyldisilazane (HMDS) to make the surface hydrophilic.
Coat wafer with sufficient photo-resist
Pre-Exposure
Expose the wafer to a desired pattern (an exemplary method uses clear out windows)
Bake after exposure
Develop and Rinse
Post Develop Bake With this method wafer positional accuracy of approximately 3 μm is achieved and the pattern can be controlled to micron size.

At step 605, the monitor wafer is placed on the wafer stage, with at least one pattern at a predetermined location on the wafer, corresponding to (lying directly above) a predetermined location on the wafer stage if the wafer stage has zero offset from a registration position.

At step 606, a beam is applied to a position where the pattern on the wafer would be located if the wafer stage has zero offset. At least one of the group consisting of reflected, transmitted and scattered portions of the beam is measured, and detected portions of the beam are analyzed.

At step 608, the system detects whether the wafer stage has one or more non-zero offsets based on the measured portion of the beam. The X and Y offsets are determined, based on the distance the stage must be moved to find the optimum position (minimum signal for a negative contrast material pattern, maximum signal for a positive contrast material pattern.

At step 610, a location of at least a second pattern is determined, from which the translation vector separating the first and second pattern is determined.

At step 612, the translation vector is compared to the expected translation vector.

At step 614, an angular offset is detected, based on the comparison of step 612.

At step 616, a stage focus error, if any, is detected based on the Z offset (i.e., on the distance the stage is raised or lowered to achieve the optimum signal return 192.

Although an exemplary sequence of operations is shown in FIG. 6, other sequences may be used. For example, the beam focus can be calibrated before the X and Y offsets are determined, or between determining the X and Y offsets and the angular offset.

Figure 7:
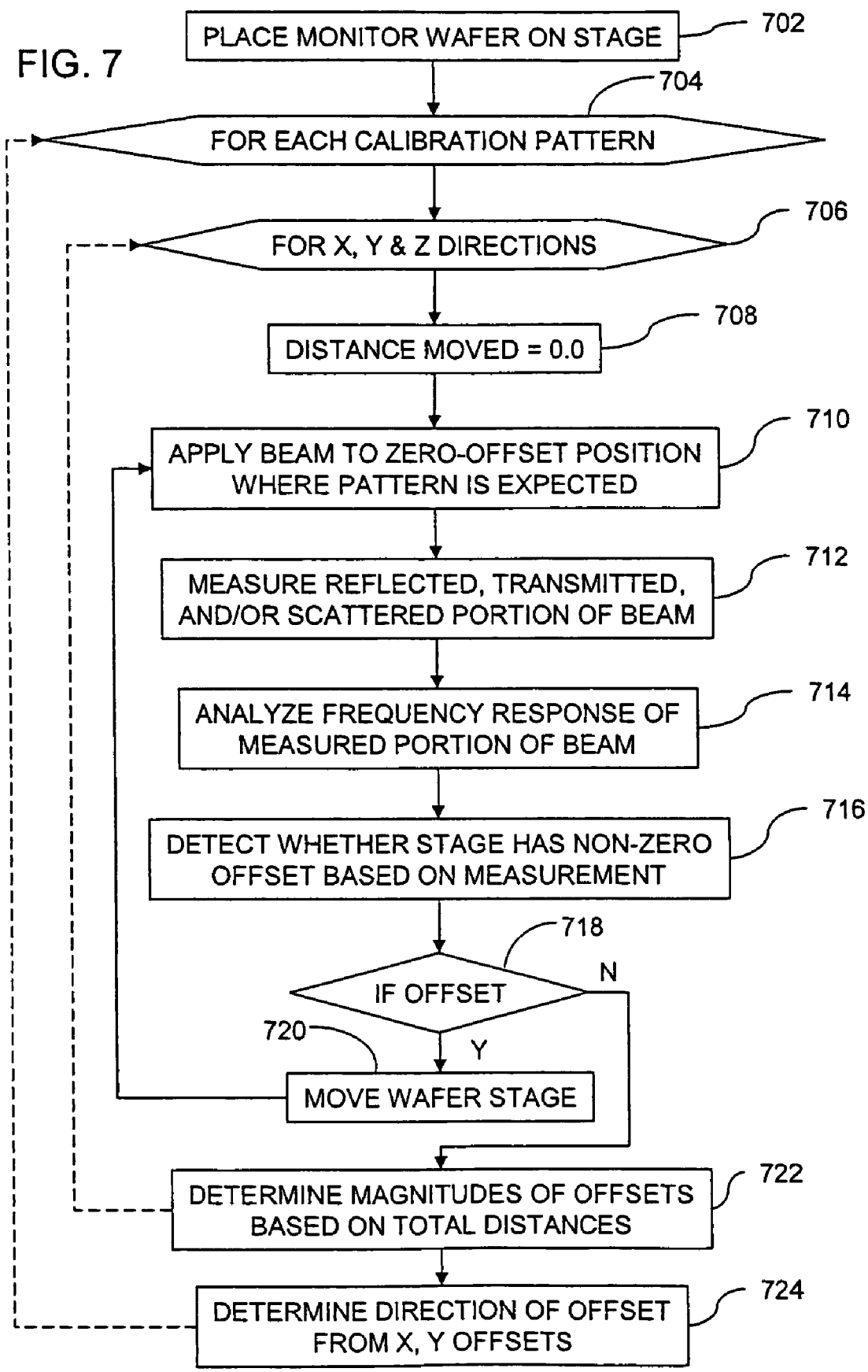
FIG. 7 is a detailed flow diagram showing the steps of measuring and detecting translational and angular offsets.

FIG. 7 is a more detailed flow diagram of a calibration process. Some of the steps in FIG. 7 may be performed by the detecting means (including steps 708, 714, 716, 718, 722, 724).

At step 702 the monitor wafer is placed on the metrology tool wafer stage. This may be performed by a robot end effector, or other robotic arm or pick and place device (not shown).

At step 704, a loop including steps 706–724 is performed for each of a plurality of calibration patterns (or markings). If the wafer has several calibration patterns, the loop may be performed for all of the patterns or for a subset of the patterns. To allow angle offset detection, the loop is repeated for at least two of the patterns.

At step 706, a loop including steps 708–722 is repeated for X, Y and Z directions.

At step 708, the total distance moved is reset to zero.

At 710, the beam source applies the beam to the zero-offset position where the pattern is expected (i.e., where the pattern would be if there is no stage position error.

At step 712, the sensor detects the reflected, transmitted and/or scattered portion(s) of the beam.

At step 714, the detecting means analyzes the frequency response of the measured portion of the beam.

At step 716, the detecting means determines whether the stage has a non-zero stage offset based on the measurement. If a negative resist is used, then a high frequency response indicates a non-zero offset. If a positive resist is used, then a low, flat frequency response indicates a non-zero offset.

At step 718, if an offset has been detected, step 720 is executed. If no offset has been detected, then step 722 is executed.

At step 720, the wafer stage is moved incrementally, and the detecting means loops back to step 710. Steps 710–718 are repeated, until no offset is detected at step 716.

At step 722, the magnitude of the offset in the X direction is determined by the total distance the wafer stage is moved in the X direction to achieve the optimum frequency response. The magnitude of the offset in the Y direction is determined by the total distance the wafer stage is moved in the Y direction to achieve the optimum frequency response of the movement.

At step 724, the direction of the offset (within the plane of the wafer) is determined based on the X and Y offsets.

The calibration wafers described above can be prepared without wafer damage and/or operator interaction. Additionally, the calibration technique can be performed under standard operating conditions with no recovery period between calibration and operation. Calibration location accuracy of nanometer scale is achievable and can be routinely performed at multiple wafer locations.

The methods described above can provide faster wafer stage calibration. Improved, highly accurate calibration criteria may be used. Optionally, a complex calibration pattern, spot size, wafer property gradient may be used. Standard instrument operating conditions can be retained.

The system can provide early tool drift warning and notification. The system can also provide component specific stage drift determination including x and y stage motion controllers (belts, motors, etc.), wafer flat (notch) finder calibration, and hardware failures. For example, if the center of the stage has zero positional offset, but the patterns on the perimeter are offset (by an angle), then this indicates that there may be a problem with the flat finder. A pure X-Y translation is an indication of a drive train problem, such as a belt or motor problem. Typically, if the drive train problem is observed sporadically, it is more likely a belt problem. If the problem is observed consistently, it is more likely a motor problem. Stage motion restriction determination is possible, i.e. cable tension, mechanical blockage. Optical degradation can be detected, such as scattering, defocusing, and the like, related to optical component condition and alignment, including source, detector, interferometer/monochronometer/modulator, relay optics, instrument environment, optical windows.

Although the examples described above include a special purpose monitor wafer, with the contrast film formed on the bare semiconductor, any wafer may be used for the stage offset calibration method by placing the desired patterns on the wafer. Thus, the patterns may be on a layer above the surface of the substrate, with one or more intervening layers therebetween. More generally, any solid substrate including a top surface having patterns with predetermined locations may be used. The substrate is not limited to silicon or any specific semiconductor material, and is not limited to a disc or circular shape.

The present invention may include computer-implemented processes and apparatus for practicing those processes. The present invention may also be embodied in the form of computer program code embodied in tangible media, such as floppy diskettes, read only memories (ROMs), CD-ROMs, hard drives, ZIP™ disks, memory sticks, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of calibrating a positioning stage, comprising the steps of:
   (a) placing a substrate on the positioning stage, the substrate having a contrast film above a portion thereof, with at least one pattern at a predetermined location above the substrate, corresponding to a predetermined location on the positioning stage if the positioning stage has zero offset from a registration position, the substrate having a second film on at least a portion of the contrast film;
   (b) applying a beam to a position where the pattern on the substrate would be located if the positioning stage has zero offset;
   (c) measuring at least one of the group consisting of reflected, transmitted and scattered portions of the beam from the contrast film and from the second film; and
   (d) detecting whether the positioning stage has a non-zero offset based on the measured portion of the beam reflected, transmitted or scattered from the contrast film and the measured portion of the beam reflected, transmitted or scattered from the second film.

2. A method of calibrating a positioning stage, comprising the steps of:
   (a) placing a substrate on the positioning stage, the substrate having a contrast film above a portion thereof, with at least one pattern at a predetermined location above the substrate, corresponding to a predetermined location on the positioning stage if the positioning stage has zero offset from a registration position;
   (b) applying a beam to a position where the pattern on the substrate would be located if the positioning stage has zero offset;
   (c) measuring at least one of the group consisting of reflected, transmitted and scattered portions of the beam; and
   (d) detecting whether the positioning stage has a non-zero offset based on the measured portion of the beam, wherein the measured portion of the beam has a first frequency distribution if the positioning stage has a zero offset, and a second frequency distribution if the positioning stage has a non-zero offset.

3. The method of claim 1, further comprising:
   (e) moving the positioning stage if an offset is detected;
   (f) repeating steps (b), (c), (d) and (e) until no offset is detected; and
   (g) determining a magnitude and direction of the offset of the positioning stage based on a total distance and direction the positioning stage is moved.

4. The method of claim 1, wherein the beam is one of the group consisting of a Microwave, Infrared, Visible, UV, Xray, or Electron beam.

5. The method of claim 1, wherein the substrate is a semiconductor wafer, and the contrast film comprises at least one of the group consisting of photoresist, metal, oxide, and nitride.

6. The method of claim 1, wherein the substrate is an etch modified substrate.

7. The method of claim 1, wherein the contrast film is a silicon oxide, and the second film is a photoresist.

8. The method of claim 1, wherein the substrate includes a second pattern disposed at a different angular position on the substrate from the first pattern, the method further comprising:
   determining a translation vector separating the first and second patterns; and
   detecting an angular offset of the positioning stage, based on the translation vector.

9. The method of claim 1, wherein the substrate is a monitor wafer, the method further comprising, before step (a), the steps of:
   depositing the contrast film on a bare semiconductor wafer; and
   etching the pattern in the contrast film, to form the monitor wafer.

10. The method of claim 1, wherein the pattern includes a plurality of rectangles arranged around a perimeter of the substrate.

11. A system for calibrating a positioning stage, comprising:
- a substrate adapted to be placed on the positioning stage, the substrate having a contrast film above a portion thereof, with at least one pattern at a predetermined location above the substrate, corresponding to a predetermined location on the positioning stage if the positioning stage has zero offset from a registration position, the substrate having a second film on at least a portion of the contrast film;
- a beam source that applies a beam to a position where the pattern on the substrate would be located if the positioning stage has zero offset;
- a sensor for measuring at least one of the group consisting of reflected, transmitted and scattered portions of the beam from the contrast film, and for measuring reflected, transmitted or scattered portions of the beam from the second film; and
- means for detecting whether the positioning stage has a non-zero offset based on the measured portion of the beam, wherein the detecting means determines whether the positioning stage has an offset based on the measured portions of the beam reflected, transmitted or scattered from the contrast film and the measured portions of the beam reflected, transmitted or scattered from the second film.

12. The system of claim 11, wherein the measured portion of the beam has a first frequency distribution if the positioning stage has a zero offset, and a second frequency distribution if the positioning stage has a non-zero offset.

13. The system of claim 11, wherein the beam includes at least one of the group consisting of a Microwave, Infrared, Visible, UV, Xray, or Electron beam.

14. The system of claim 11, wherein the contrast film comprises at least one of the group consisting of photoresist, metal, oxide, and nitride.

15. The system of claim 11, wherein the substrate is an etch-modified substrate.

16. The system of claim 11, wherein the contrast film is a silicon oxide, and the second film is a photoresist.

17. The system of claim 11, wherein the substrate includes a second pattern disposed at a different angular position on the substrate from the first pattern, the system further comprising:
- means for determining a translation vector separating the first and second patterns; and
- means for detecting an angular offset of the positioning stage, based on the translation vector.

18. The system of claim 11, wherein the pattern includes a plurality of rectangles arranged around a perimeter of the substrate.

19. A monitor wafer, comprising:
- a semiconductor substrate; and
- a contrast film above the substrate, the contrast film including a plurality of positive or negative patterns of geometrical objects distributed at a plurality of respectively different angles with respect to a reference location on the substrate,
- wherein the plurality of geometrical objects includes a plurality of first rectangular contrast film portions, and the monitor wafer further includes a plurality of second rectangular contrast film portions on one or more of the first rectangular contrast film portions.

20. The monitor wafer of claim 19, wherein the plurality of geometrical objects includes four rectangles spaced 90 degrees apart.

21. The monitor wafer of claim 20, wherein the plurality of rectangles are located proximate to a circumference of the monitor wafer.

22. The monitor wafer of claim 19, wherein the contrast film comprises at least one of the group consisting of photoresist, metal, oxide, and nitride.

23. The monitor wafer of claim 19, wherein the monitor wafer includes an etch-modified substrate.

24. The monitor wafer of claim 19, wherein the pattern is a positive pattern.

25. The monitor wafer of claim 19, wherein each second rectangular contrast film portion is smaller than the corresponding contrast film portion on which that second rectangular contrast film portion is located.

26. The monitor wafer of claim 19, wherein the substrate is silicon, the first film is a silicon oxide, and the second film is a photoresist.

* * * * *